(12) United States Patent
Muraoka et al.

(10) Patent No.: US 11,309,991 B2
(45) Date of Patent: Apr. 19, 2022

(54) WIRELESS RECEIVER APPARATUS

(71) Applicants: NEC CORPORATION, Tokyo (JP); OSAKA UNIVERSITY, Suita (JP); THE DOSHISHA, Kyoto (JP)

(72) Inventors: Kazushi Muraoka, Tokyo (JP); Naoto Ishii, Tokyo (JP); Takumi Takahashi, Osaka (JP); Seiichi Sampei, Osaka (JP); Shinsuke Ibi, Kyoto (JP)

(73) Assignees: NEC CORPORATION, Tokyo (JP); OSAKA UNIVERSITY, Suita (JP); THE DOSHISHA, Kyoto (JP)

(*) Notice: Subject to any disclaimer, the term of this patent is extended or adjusted under 35 U.S.C. 154(b) by 0 days.

(21) Appl. No.: 17/230,323

(22) Filed: Apr. 14, 2021

(65) Prior Publication Data
US 2021/0320750 A1 Oct. 14, 2021

(30) Foreign Application Priority Data

Apr. 14, 2020 (JP) .............................. JP2020-072107

(51) Int. Cl.
H04L 1/00 (2006.01)
H03M 13/11 (2006.01)

(52) U.S. Cl.
CPC ....... H04L 1/0045 (2013.01); H03M 13/1111 (2013.01); H04L 1/0057 (2013.01)

(58) Field of Classification Search
CPC .................................................... H04L 1/0045
USPC ................................ 714/726, 725, 728, 724
See application file for complete search history.

(56) References Cited

U.S. PATENT DOCUMENTS

| | | | | |
|---|---|---|---|---|
| 2006/0227902 A1* | 10/2006 | Kaynak | ............. | H04L 25/03076 375/340 |
| 2014/0169409 A1* | 6/2014 | Ma | ........................ | H04B 1/707 375/146 |
| 2014/0269663 A1* | 9/2014 | Nikopour | ............... | H04B 1/707 370/342 |
| 2017/0149444 A1* | 5/2017 | Lin | .................. | H03M 13/2757 |

OTHER PUBLICATIONS

Pritam Som, et al., "Improved Large-MIMO Detection Based on Damped Belief Propagation", 2010 IEEE Information Theory Workshop on Information Theory (ITW 2010, Cairo), 2010, 5 pages.
Takumi Takahashi, et al., "Design of Criterion for Adaptively Scaled Belief in Iterative Large MIMO Detection", IEICE Transactions on Communications, Feb. 2019, pp. 285-297, vol. E102-B, No. 2.

* cited by examiner

Primary Examiner — Fritz Alphonse
(74) Attorney, Agent, or Firm — Sughrue Mion, PLLC

(57) ABSTRACT

A BP detector of a wireless receiver apparatus reads a first parameter set or a second parameter set. The first parameter set includes a plurality of scaling factors and a plurality of damping factors learned together using a deep learning technique. The second parameter set includes a plurality of scaling factors and a plurality of node selection factors learned together using a deep learning technique from a memory. The BP detector executes an iterative BP algorithm that uses the first parameter set or the second parameter set in order to perform multi-user detection.

13 Claims, 13 Drawing Sheets

450

| | TOTAL NUMBER OF ITERATIONS | | |
|---|---|---|---|
| | 3 | 8 | 16 |
| 1ST ITERATION | $a_3^{(1)}, \eta_3^{(1)}$ | $a_8^{(1)}, \eta_8^{(1)}$ | $a_{16}^{(1)}, \eta_{16}^{(1)}$ |
| 2ND ITERATION | $a_3^{(2)}, \eta_3^{(2)}$ | $a_8^{(2)}, \eta_8^{(2)}$ | $a_{16}^{(2)}, \eta_{16}^{(2)}$ |
| 3RD ITERATION | $a_3^{(3)}, \eta_3^{(3)}$ | $a_8^{(3)}, \eta_8^{(3)}$ | $a_{16}^{(3)}, \eta_{16}^{(3)}$ |
| ⋮ | | ⋮ | ⋮ |
| 8TH ITERATION | | $a_8^{(8)}, \eta_8^{(8)}$ | $a_{16}^{(8)}, \eta_{16}^{(8)}$ |
| ⋮ | | | ⋮ |
| 16TH ITERATION | | | $a_{16}^{(16)}, \eta_{16}^{(16)}$ |

Fig. 8

| | TOTAL NUMBER OF ITERATIONS | | |
|---|---|---|---|
| 450 | 3 | 8 | 16 |
| 1ST ITERATION | $a_3^{(1)}, \{\eta_{3,i,t-k}^{(1)}\}$ | $a_8^{(1)}, \{\eta_{8,i,t-k}^{(1)}\}$ | $a_{16}^{(1)}, \{\eta_{16,i,t-k}^{(1)}\}$ |
| 2ND ITERATION | $a_3^{(2)}, \{\eta_{3,i,t-k}^{(2)}\}$ | $a_8^{(2)}, \{\eta_{8,i,t-k}^{(2)}\}$ | $a_{16}^{(2)}, \{\eta_{16,i,t-k}^{(2)}\}$ |
| 3RD ITERATION | $a_3^{(3)}, \{\eta_{3,i,t-k}^{(3)}\}$ | $a_8^{(3)}, \{\eta_{8,i,t-k}^{(3)}\}$ | $a_{16}^{(3)}, \{\eta_{16,i,t-k}^{(3)}\}$ |
| ... | | ... | ... |
| 8TH ITERATION | | $a_8^{(8)}, \{\eta_{8,i,t-k}^{(8)}\}$ | $a_{16}^{(8)}, \{\eta_{16,i,t-k}^{(8)}\}$ |
| ... | | | ... |
| 16TH ITERATION | | | $a_{16}^{(16)}, \{\eta_{16,i,t-k}^{(16)}\}$ |

Fig. 9

WIRELESS RECEIVER APPARATUS

INCORPORATION BY REFERENCE

This application is based upon and claims the benefit of priority from Japanese patent application No. 2020-072107, filed on Apr. 14, 2020, the disclosure of which is incorporated herein in its entirety by reference.

TECHNICAL FIELD

The present disclosure relates to a radio communication system, and in particular, to received signal processing.

BACKGROUND ART

Large-scale multi-user Multi-Input Multi-Output (MIMO) has been implemented in many wireless systems. The large-scale multi-user MIMO is also referred to as massive MIMO. The large-scale multi-user MIMO (or massive MIMO) can be used, for example, for uplink of a multiple access cellular system such as a 5th generation (5G) system. A receiver in the large-scale multi-user MIMO (massive MIMO) needs to perform Multi-User Detection (MUD) in order to separate multi-user signals.

One of the known MUD algorithms is a Belief Propagation (BP) algorithm (see, for example, Non-Patent Literature 1 and 2). The BP algorithm propagates quality values (these are called beliefs) that represent the reliability of detection symbols between iteration processes, to thereby gradually improve the detection accuracy. Practically, a detector that uses the BP algorithm includes a Soft Interference Canceller (IC), a Belief Generator (BG)), and a Soft Replica Generator (RG). The soft interference canceller subtracts interference components from received signals using replicas of respective transmission symbols obtained in the previous iteration. The belief generator generates beliefs based on post-cancellation signals. The soft replica generator generates replicas of transmitted signals based on the beliefs.

Techniques for improving the performance of soft decision detection or decoding that uses the BP algorithm include damping, scaling, and node selection. In the damping, a weighted average of the previous belief generated in the previous iteration and the current belief generated in the current iteration is used as a new belief, thereby stabilizing the fluctuations of beliefs that cause poor convergence (see Non-Patent Literature 1). A damping factor defines a weighting factor (or coefficient) of the weighted average. The scaling takes into account that the reliability of beliefs in early iterations is relatively low, and accordingly uses a parameter (i.e., scaling factor) for adjusting the absolute values of the beliefs so that they become gradually larger as the number of iterations increases, (see Non-Patent Literature 2). In the case of the MIMO detection, the node selection is used as a countermeasure against fading spatial correlations (i.e., correlations among receiving antennas) (see Non-Patent Literature 2). Specifically, in the node selection, a set of receiving antenna elements is divided into a plurality of subsets. Each subset is composed of receiving antenna elements spatially separated from each other (i.e., having lower correlations). The BP algorithm that involves node selection updates only the beliefs of one subset in each BP iteration and sequentially updates the beliefs of the other subsets in the following BP iterations.

Non-Patent Literature

Non-Patent Literature 1: P. Som, T. Datta, A. Chockalingam and B. S. Rajan, "Improved large-MIMO detection based on damped belief propagation," 2010 IEEE Information Theory Workshop on Information Theory (ITW 2010, Cairo), Cairo, 2010, pp. 1-5.

Non-Patent Literature 2: T. Takahashi, S. IBI and S. SAMPEI, "Design of Criterion for Adaptively Scaled Belief in Iterative Large MIMO Detection," IEICE TRANSACTIONS on Communications, 2019 Volume E102.B Issue 2 Pages 285-297

SUMMARY

The values of the damping factor and the values of the scaling factor are typically determined (or adjusted) individually and empirically through, for example, computer simulations. On the other hand, the inventors have found that there is a correlation between the damping factor and the scaling factor and, accordingly, that an increase in the required number of iterations or a reduction in the detection performance would occur unless the value of the scaling factor suitable to the value of the damping factor, or vice versa, is appropriately selected. However, a suitable combination of the values of these parameters varies per iteration, and in addition there are a huge number of candidate combinations. It is thus difficult to determine an optimal combination of values of the scaling and damping factors used in each iteration.

Further, as described above, the BP algorithm that involves the node selection uses predetermined subsets and updates the beliefs for each subset in a sequential manner. That is, the same division into subsets are used through all the iterations. However, since the impact of fading spatial correlations is mitigated as the iterations proceed and as the reliability of the beliefs improves, using a different subset per iteration may contribute to reducing the total number of iterations required to accomplish a desired performance. However, it is difficult to determine an optimal subset used in each iteration. In addition, when the scaling and the node selection are both used, it becomes more difficult to determine both an optimal value of the scaling factor and an optimal subset (i.e., an optimal combination of receiving antenna elements whose beliefs are to be updated) used in each iteration.

One of the objects to be attained by embodiments disclosed herein is to provide an apparatus, a method, and a program that allow a wireless receiver apparatus to use a near-optimal set of a scaling factor and a damping factor (or a scaling factor and a node selection factor) in each Belief Propagation (BP) iteration. It should be noted that this object is merely one of the objects to be attained by the embodiments disclosed herein. Other objects or problems and novel features will be made apparent from the following description and the accompanying drawings.

In a first aspect, a wireless receiver apparatus includes at least one memory and a BP detector. The at least one memory is configured to store a first parameter set or a second parameter set. The first parameter set includes a plurality of scaling factors and a plurality of damping factors learned together using a deep learning technique. The second parameter set includes a plurality of scaling factors and a plurality of node selection factors learned together using a deep learning technique. The BP detector is configured to execute an iterative BP algorithm that uses the first parameter set or the second parameter set in order to perform multi-user detection.

In a second aspect, a method performed by a wireless receiver apparatus includes the following steps:

(a) reading a first parameter set or a second parameter set from a memory, the first parameter set including a plurality of scaling factors and a plurality of damping factors learned together using a deep learning technique, the second parameter set including a plurality of scaling factors and a plurality of node selection factors learned together using a deep learning technique; and (b) executing an iterative BP algorithm that uses the first parameter set or the second parameter set in order to perform multi-user detection.

In a third aspect, a method implemented in a computer includes the following steps:

(a) receiving a set of training data, wherein each training data includes a plurality of transmitted signals and a plurality of received signals corresponding to the plurality of transmitted signals;

(b) executing an iterative BP algorithm in the set of training data, wherein the iterative BP algorithm uses a plurality of scaling factors and a plurality of damping factors, or uses a plurality of scaling factors and a plurality of a node selection factors; and (c) generating a learned set of the scaling factors and the damping factors, or a learned set of the scaling factors and the node selection factors, by training the iterative BP algorithm using a deep learning technique.

In a fourth aspect, a program includes instructions (software codes) that, when loaded into a computer, cause the computer to perform the method according to the above-described second or third aspect.

BRIEF DESCRIPTION OF DRAWINGS

The above and other aspects, features, and advantages of the present invention will become more apparent from the following description of certain exemplary embodiments when taken in conjunction with the accompanying drawings, in which:

FIG. 8 is a diagram showing one example of a lookup table according to an embodiment;

FIG. 9 is a diagram showing one example of a lookup table according to an embodiment;

EMBODIMENTS

Specific embodiments will be described hereinafter in detail with reference to the drawings. The same or corresponding elements are denoted by the same symbols throughout the drawings, and duplicated explanations are omitted as necessary for the sake of clarity.

Figure 1:
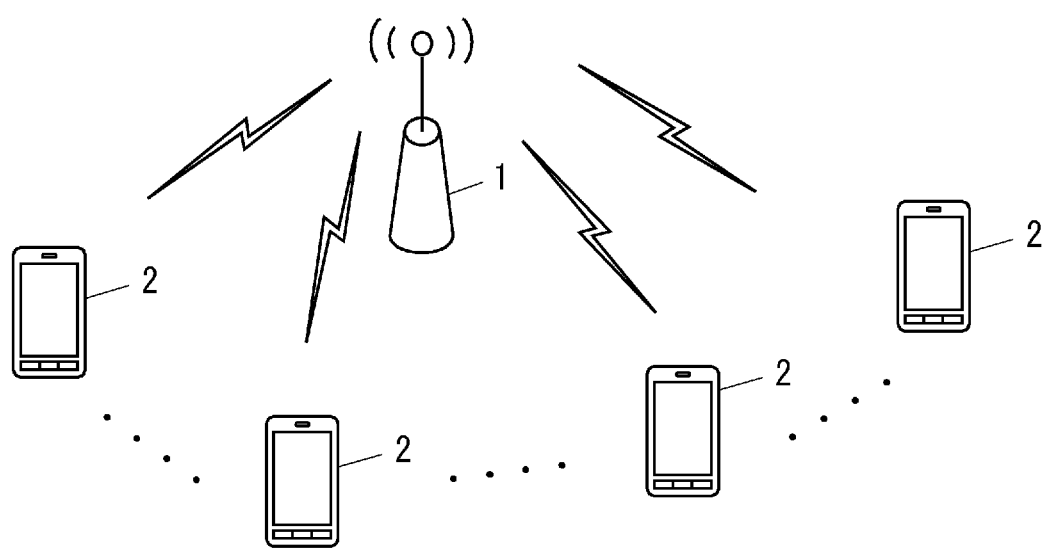
FIG. 1 is a diagram showing a radio communication system according to an embodiment.

FIG. 1 shows a configuration example of a radio communication system (i.e., a multiple access cellular system) according to a plurality of embodiments including this embodiment. Referring to FIG. 1, a base station 1 provides wireless access for a plurality of radio terminals 2. The base station 1 may also be referred to as an access point, a transmission/reception point (TRP), or other names. The base station 1 may be, for example, a gNB or a gNB Distributed Unit (gNB-DU) of a 5G system. In some implementations, the radio communication system may use a multi-user MIMO technique for uplink transmissions from the plurality of radio terminals 2 to the base station 1. In this case, the base station 1 may receive reference signals from the radio terminals 2, estimate a MIMO channel between the radio terminals 2 and the base station 1 using the received reference signals, receive data signals from the radio terminals 2, and detect transmitted signals using the estimated channel. That is, the base station 1 may perform MIMO detection in order to separate multi-user signals of the plurality of radio terminals 2.

Figure 2:
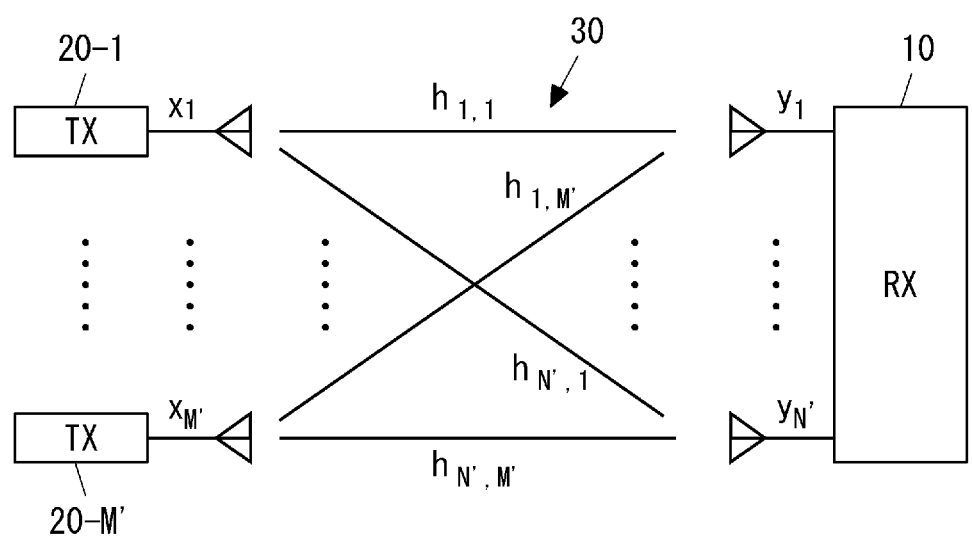
FIG. 2 is a diagram showing a system model according to an embodiment.

FIG. 2 shows one example of a system model of uplink multi-user MIMO transmission. In FIG. 2, transmitters 20 of the respective radio terminals 2 communicate with a receiver 10 of the base station 1 through a channel (propagation path) 30. In the example shown in FIG. 2, each of the M' transmitters 20 includes one transmitting antenna. Alternatively, each of the transmitters 20 may include two or more transmitting antennas. The receiver 10 of the base station 1 includes N' receiving antennas. It is assumed that the total number of transmitting antennas, M', is equal to or smaller than the total number of receiving antennas, N'.

In the following description, for the sake of simplicity, it is assumed that the transmitted signal from each radio terminal 2 (or each user) is a single carrier transmitted signal and the propagation path between each radio terminal 2 and the base station 1 is a flat-fading channel. Incidentally, in a multipath-fading environment where the transmitted signal from each user uses Orthogonal Frequency Division Multiplexing (OFDM), Single Carrier-Frequency Division Multiple Access (SC-FDMA) or the like, it may also be assumed that the propagation path of each subcarrier is a flat-fading channel by inserting a cyclic prefix having an appropriate length into the transmitted signal. Accordingly, this embodiment may be applied to OFDM and SC-FDMA.

Quadrature amplitude modulation (QAM) modulated transmitted signals are transmitted from the M' transmitting antennas of the plurality of radio terminals 2 and received by the base station 1 equipped with the N' receiving antennas. In this case, using the equivalent low-pass representation, a complex valued signal model can be expressed by the following equation:

$$y^c = H^c x^c + z^c$$

where $y^c$ is an N'×1 (i.e., N' rows and one column) complex received signal vector, $H^c$ is an N'×M' complex MIMO channel matrix, $z^c$ is an N'×1 complex noise vector, and $x^c$ is an M'×1 complex transmitted signal vector.

Denoting the number of the QAM modulation symbols as Q', Q' is equal to 4 in Quadrature Phase shift Keying (QPSK), while Q' is equal to 16 in 16QAM. It is assumed that the amplitude of the modulation symbol of each of the I axis and the Q axis is {+c,−c} in QPSK and it is {+c,−c,+3c,−3c} in 16QAM. The value c can be expressed by the following equation, where $E_s$ is average signal power. The power of complex noise in each of the receiving antennas is denoted by $N_0$.

$$c = \sqrt{\frac{3E_s}{2(Q'-1)}}$$

For the sake of simplicity, a received signal model, obtained by replacing the equivalent low-pass complex representation with an equivalent real-valued signal model y, can be expressed by the following equations:

$$y = Hx + z$$

$$y = \begin{bmatrix} \Re(y^c) \\ \Im(y^c) \end{bmatrix}$$

$$x = \begin{bmatrix} \Re(x^c) \\ \Im(x^c) \end{bmatrix}$$

$$z = \begin{bmatrix} \Re(z^c) \\ \Im(z^c) \end{bmatrix}$$

$$H = \begin{bmatrix} \Re(H^c) & -\Im(H^c) \\ \Im(H^c) & \Re(H^c) \end{bmatrix}$$

where y is an N×1 equivalent real-valued received signal vector, H is an N×M equivalent real-valued MIMO channel matrix, z is an N×1 equivalent real-valued noise vector, and x is an M×1 equivalent real-valued transmitted signal vector. The value N is equal to 2N', while the value M is equal to 2M'. Each transmitted signal is equivalent to a Pulse Amplitude Modulation (PAM) modulated symbol having the number of the modulation symbols Q equal to $\sqrt{Q'}$ (i.e., square root of Q'), while the average signal power is $E_s/2$. Further, noise power included in each element of the noise vector z is $N_0/2$. The following provides a description of reception processing using the equivalent real-valued model.

Figure 3:
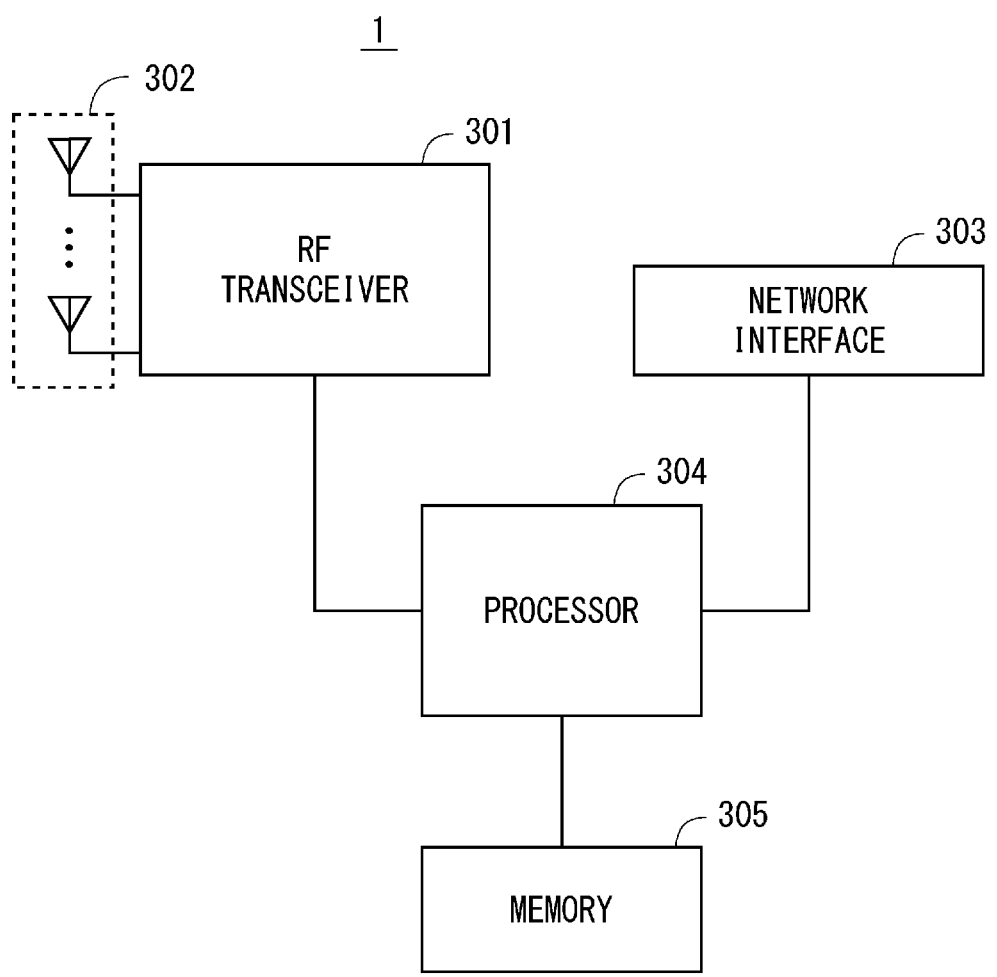
FIG. 3 is a diagram showing a configuration example of a base station according to an embodiment.

FIG. 3 shows a configuration example of the base station 1. Referring to FIG. 3, the base station 1 includes a Radio Frequency (RF) transceiver 301, a network interface 303, a processor 304, and a memory 305. The RF transceiver 301 performs analog RF signal processing in order to communicate with the radio terminals 2. The RF transceiver 301 may include a plurality of transceivers. The RF transceiver 301 is coupled to an antenna array 302 and the processor 304. The RF transceiver 301 receives modulated symbol data from the processor 304, generates a transmission RF signal, and supplies the transmission RF signal to the antenna array 302. Further, the RF transceiver 301 generates a baseband received signal based on a received RF signal received by the antenna array 302 and supplies the baseband received signal to the processor 304. The RF transceiver 301 may include an analog beamformer circuit for beam forming. The analog beamformer circuit includes, for example, a plurality of phase shifters and a plurality of power amplifiers.

The network interface 303 is used to communicate with network nodes (e.g., another base station and a core network node). The network interface 303 may include, for example, a network interface card (NIC) conforming to the IEEE 802.3 series.

The processor 304 performs digital baseband signal processing (i.e., data-plane processing) and control-plane processing for radio communication. The processor 304 may include a plurality of processors. The processor 304 may include, for example, a modem processor (e.g., a Central Processing Unit (CPU), a graphics processing unit (GPU), or a Digital Signal Processor (DSP)) that performs digital baseband signal processing and a protocol stack processor (e.g., a Central Processing Unit (CPU) or a Micro Processing Unit (MPU)) that performs the control-plane processing.

The digital baseband signal processing by the processor 304 may include, for example, signal processing of a Service Data Adaptation Protocol (SDAP) layer, a Packet Data Convergence Protocol (PDCP) layer, a Radio Link Control (RLC) layer, a Medium Access Control (MAC) layer, and a Physical (PHY) layer. Further, the control-plane processing performed by the processor 304 may include processing of Non-Access Stratum (NAS) messages, Radio Resource Control (RRC) messages, Medium Access Control (MAC) Control Elements (CEs), and Downlink Control Information (DCI).

The processor 304 may include a digital beamformer module for beam forming. The digital beamformer module may include a MIMO encoder and a pre-coder.

The memory 305 is composed of a combination of a volatile memory and a non-volatile memory. The volatile memory is, for example, a Static Random Access Memory (SRAM), a Dynamic RAM (DRAM), or a combination thereof. The non-volatile memory is, for example, a mask Read Only Memory (MROM), an Electrically Erasable Programmable ROM (EEPROM), a flash memory, a hard disc drive, or any combination thereof. The memory 305 may include a storage located apart from the processor 304. In this case, the processor 304 may access the memory 305 via the network interface 303 or another I/O interface.

The memory 305 may include a computer readable medium storing one or more software modules (computer programs) including instructions and data to perform at least a part of processing by the base station 1. In some implementations, the processor 304 may be configured to load the software modules from the memory 305 and execute the loaded software modules, thereby performing at least a part of the processing by the base station 1.

According to this embodiment, the processor 304 causes the base station 1 to perform received signal processing for multi-user detection (MIMO detection). For this purpose, the processor 304 may include a BP detector 400 and a decision and demodulation module 460 shown in FIG. 4.

The BP detector 400 receives N equivalent real-valued received signals, $y_1$ to $y_N$, obtained by the N' receiving antennas and executes the iterative BP algorithm with the total number of iterations T in order to perform multi-user detection. After that, the BP detector 400 provides the decision and demodulation module 460 with the estimated values, $r_1^{(T)}$ to $r_M^{(T)}$, regarding M separated equivalent real-valued transmitted signals.

In some implementations, the BP detector 400 uses a first parameter set in the BP algorithm. The first parameter set includes a plurality of scaling factors and a plurality of damping factors learned together (or concurrently) using a deep learning technique. The BP detector 400 uses the plurality of scaling factors in different respective iterations of the BP algorithm. Likewise, the BP detector 400 uses the plurality of damping factors in the different respective iterations of the BP algorithm. Accordingly, the total number of scaling factors and the total number of damping factors may each be equal to the total number of iterations of the BP algorithm.

In other implementations, the BP detector 400 uses a second parameter set in the BP algorithm. The second parameter set includes a plurality of scaling factors and a plurality of node selection factors learned together using a deep learning technique. The BP detector 400 uses the plurality of scaling factors in the different iterations of the BP algorithm. Likewise, the BP detector 400 uses the plurality of node selection factors in different iterations of the BP algorithm. As will be described later, the BP algorithm may use a plurality of node selection factors per iteration. In this case, the second parameter set may include a set of node selection factors per iteration.

Figure 4:
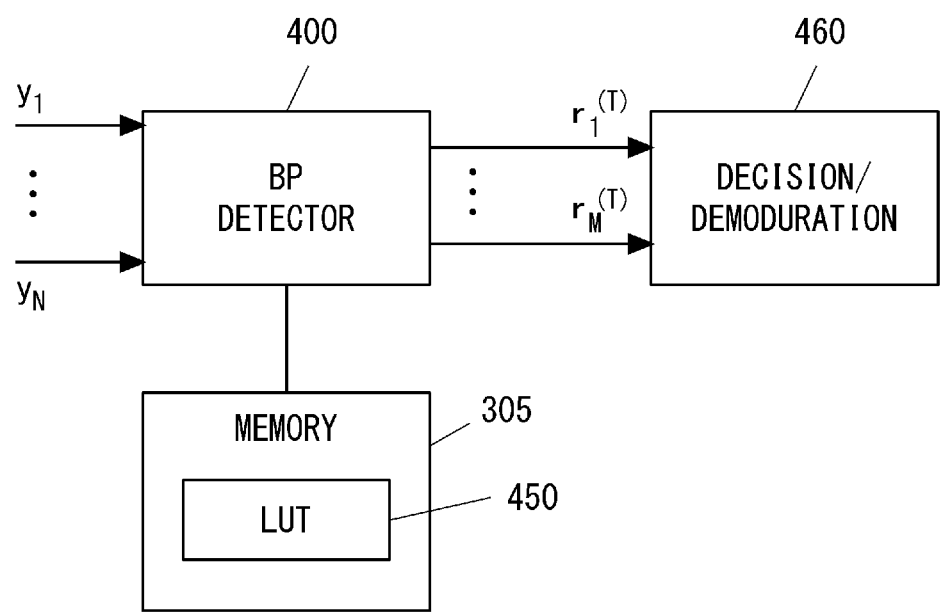
FIG. 4 is a diagram showing a configuration example of a processor of a base station according to an embodiment.

The first parameter set (or the second parameter set) is stored in the memory 305 of the base station 1. As shown in FIG. 4, the first parameter set (or the second parameter set) may be stored in the memory 305 as a lookup table (LUT) 450.

Figure 5:
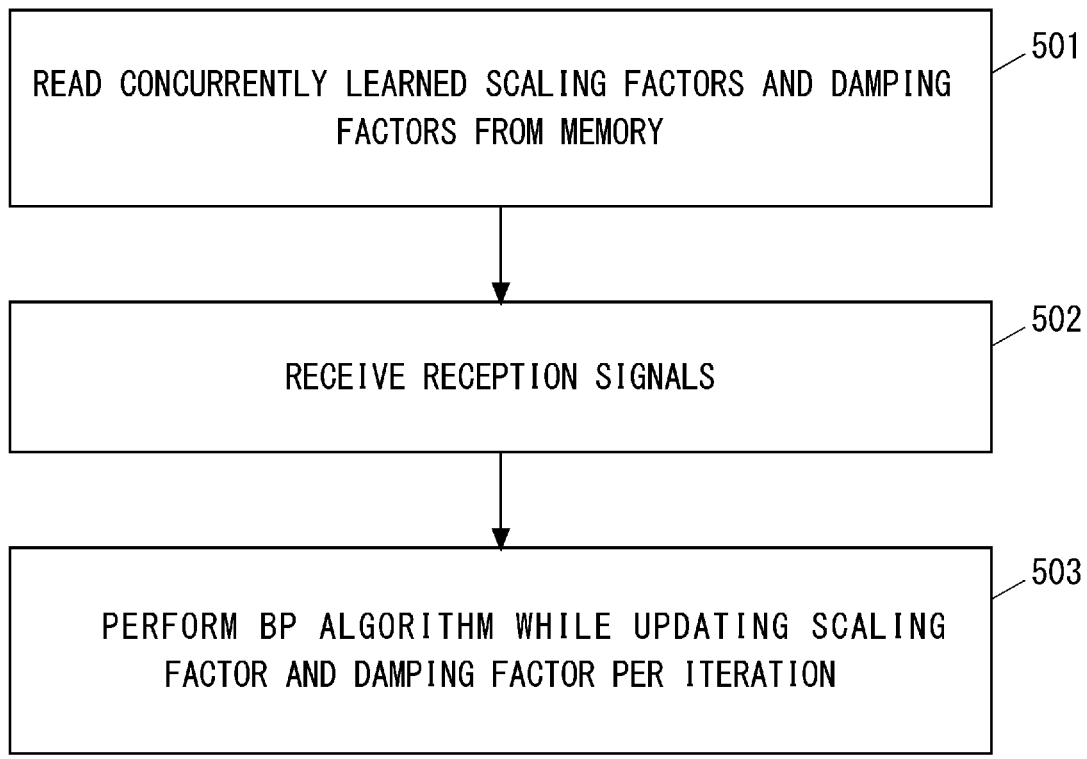
FIG. 5 is a flowchart showing one example of an operation of a base station according to an embodiment.

FIG. 5 shows one example of the operation of the base station 1. In Step 501, the processor 304 (e.g., BP detector 400) of the base station 1 reads from the memory 305 the scaling factors and the damping factors (or the scaling factors and the node selection factors), which have been learned together. In Step 502, the processor 304 (e.g., the BP detector 400) receives the received signals $y_1$-$y_N$ received by the antenna 302 via the RF transceiver 301. In Step 503, the processor 304 (e.g., the BP detector 400) performs the BP algorithm while updating the scaling factor and the damping factor (or the scaling factor and the node selection factor) per iteration and generates the estimated values $r_1^{(T)}$ to $r_M^{(T)}$ of the M separated transmitted signals. After that, the processor 304 (e.g., the decision and demodulation module 460) decodes transmitted signals of all the M users based on the estimated values $r_1^{(T)}$ to $r_M^{(T)}$.

As will be understood from the above description, in this embodiment, the BP detector 400 of the base station 1 uses the scaling factors and the damping factors learned together using a deep learning technique. Alternatively, the BP detector 400 uses the scaling factors and the node selection factors learned together using a deep learning technique. According to this embodiment, it thus becomes possible to allow the base station 1 to use a near-optimal set of a scaling factor and a damping factor (or a scaling factor and a node selection factor) in each BP iteration.

Figure 6:
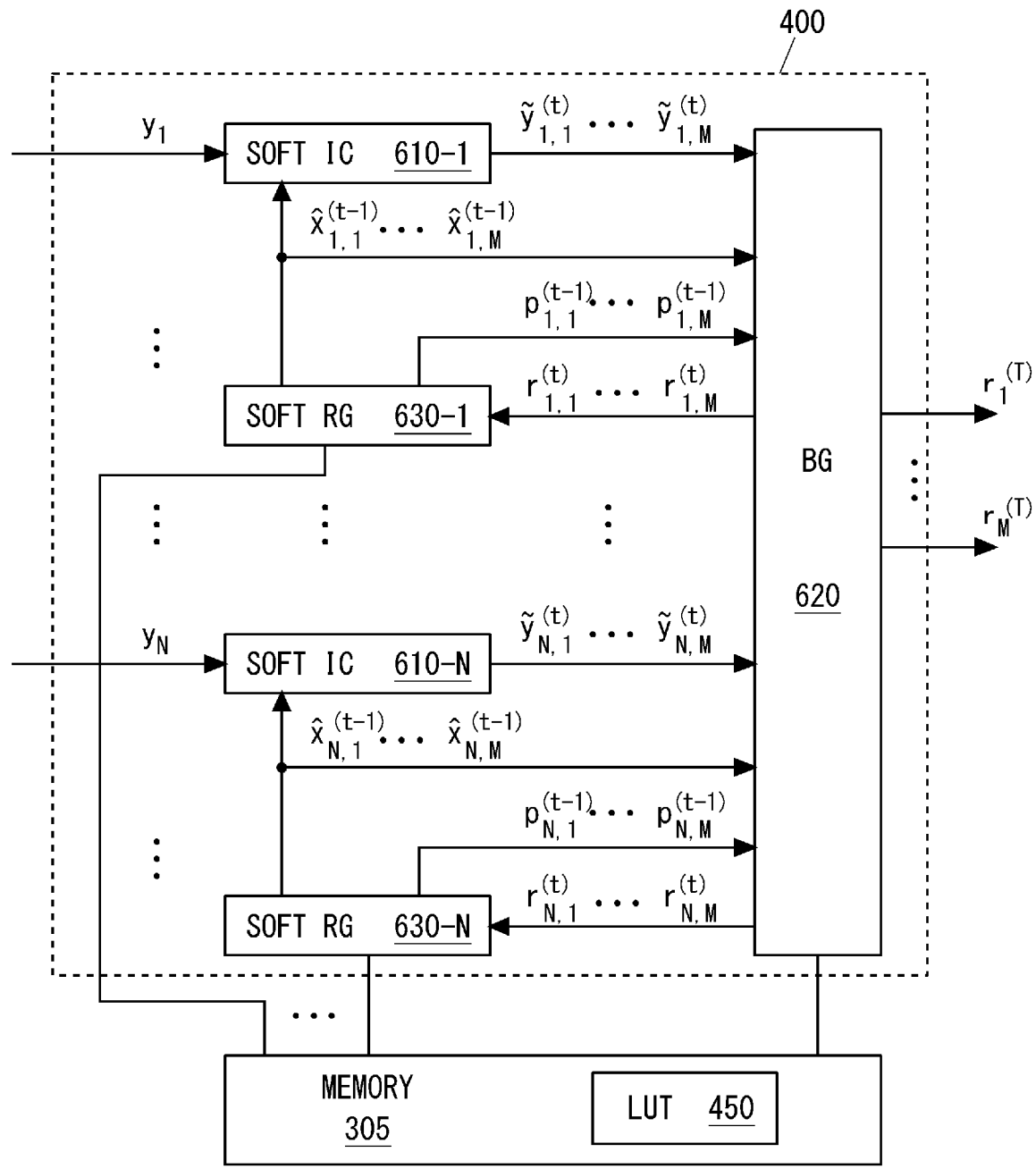
FIG. 6 is a diagram showing a configuration example of a BP detector according to an embodiment.

The following provides a description of a configuration example of the BP detector 400. FIG. 6 shows a configuration example of the BP detector 400. Referring to FIG. 6, the BP detector 400 includes N soft interference cancellers 610-1 to 610-N, a belief generator 620, and N soft replica generators 630-1 to 630-N. The soft interference cancellers 610-1 to 610-N respectively receive the N received signals $y_1$-$y_N$ obtained by the N receiving antennas. The soft interference canceller 610-1 receives, for example, the received signal $y_1$ of a first antenna (this signal is referred to as a first received signal). In addition, in order to perform the t-th iteration, the soft interference canceller 610-1 receives soft replicas x hat$_{1,1}^{(t-1)}$ to x hat$_{1,M}^{(t-1)}$ of all the transmitted signals generated in the previous (t−1)-th iteration. Here, x hat means x with circumflex (^). The soft interference canceller 610-1 then generates post-cancellation received signals y tilde$_{1,1}^{(t)}$ to y tilde$_{1,M}^{(t)}$. Here, y tilde means y with a tilde (~) above.

The belief generator 620 reads the damping factors (or the sets of node selection factors) included in the above-described first parameter set (or the second parameter set) from the LUT 450. The belief generator 620 receives the post-cancellation received signals y tilde$_{1,1}^{(t)}$ to y tilde$_{1,M}^{(t)}$ from the soft interference canceller 610-1. The belief generator 620 also receives post-cancellation received signals y tilde$_{n,1}^{(t)}$ to y tilde$_{n,M}^{(t)}$ similarly generated by each of the remaining soft interference cancellers 610-n (where n is between 2 and N). Then the belief generator 620 generates beliefs $r_{1,1}^{(t)}$ to $r_{1,M}^{(t)}$ associated with the first received signal using the damping factor (or the set of node selection factors) for the t-th iteration. Likewise, the belief generator 620 generates beliefs associated with each of the remaining second to n-th received signals.

The soft replica generator 630-1 reads the scaling factors included in the above-described first parameter set (or the second parameter set) from the LUT 450. The soft replica generator 630-1 receives the beliefs $r_{1,1}^{(t)}$ to $r_{1,M}^{(t)}$ associated with the first received signal from the belief generator 620. Then the soft replica generator 630-1 generates soft replicas x hat$_{1,1}^{(t)}$ to x hat$_{1,M}^{(t)}$ and further generates soft replica's power $p_{1,1}^{(t)}$ to $p_{1,M}^{(t)}$, using the scaling factor for the t-th iteration.

After the completion of the BP processing with the total number of iterations T, the belief generator 620 determines the estimated values $r_1^{(T)}$ to $r_M^{(T)}$ of the M separated transmitted signals and provides these estimated values for the decision and demodulation module 460.

The following provides further details of the processing performed by the soft interference canceller 610, the belief generator 620, and the soft replica generator 630.

(1) Soft Interference Canceller

In the first iteration, soft replicas have not yet been generated. The soft interference canceller 610 thus supplies the first to N-th received signals to the belief generator 620 without performing cancellation processing. In the t-th iteration, which is the second or any subsequent iteration, the soft interference canceller 610-n associated with the n-th received signal cancels M−1 transmitted signal components other than the m-th transmitted signal from the n-th received signal and generates the post-cancellation received signal y tilde$_{n,m}^{(t)}$. The post-cancellation received signal y tilde$_{n,m}^{(t)}$ is given by the following equation:

$$\tilde{y}_{n,m}^{(t)} = y_n - \sum_{\substack{j=1 \\ j \ne m}}^{M} h_{n,j} \hat{x}_{n,j}^{(t-1)}$$

where $y_n$ is the received signal of the n-th receiving antenna, $h_{n,j}$ is a channel response between the j-th transmitting antenna and the n-th receiving antenna, and x hat$_{n,j}^{(t-1)}$ is a soft replica of the transmitted signal of the j-th transmitting antenna obtained in the (t−1)-th iteration processing. As described above, the base station 1 is able to estimate the channel response using the reference signal transmitted from the radio terminal 2. The post-cancellation received signal y tilde$_{n,m}^{(t)}$ is supplied to the belief generator 620.

(2) Belief Generator

The belief generator 620 generates beliefs using the post-cancellation received signals. First, the belief generator 620 performs processing expressed by the following equation using the post-cancellation received signal y tilde$_{n,m}^{(t)}$ regarding the n-th receiving antenna, thereby obtaining a transmitted signal component $s_{n,m}^{(t)}$ in the t-th iteration:

$$s_{n,m}^{(t)} = \frac{h_{n,m} \tilde{y}_{n,m}^{(t)}}{\psi_{n,m}^{(t)}}$$

where $\psi_{n,m}^{(t)}$ is a residual interference and noise power. The residual interference and noise power $\psi_{n,m}^{(t)}$ is obtained by the following equations:

$$\psi_{n,m}^{(t)} = \sum_{\substack{j=1 \\ j \neq m}}^{M} h_{n,j}^2 \delta_{n,j}^{(t)} + \frac{N_0}{2}$$

$$\delta_{n,j}^{(t)} = p_{n,j}^{(t-1)} - (\hat{x}_{n,j}^{(t-1)})^2$$

where $p_{n,j}^{(t-1)}$ is the power of the soft replica. As described above, the soft replica's power is generated by the soft replica generator 630.

The equivalent gain $\omega_{n,m}^{(t)}$ to the true transmitted signal $x_m$ included in the transmitted signal component $s_{n,m}^{(t)}$ is used for normalization in the scaling processing and is given by the following equation:

$$\omega_{n,m}^{(t)} = \frac{h_{n,m}^2}{\psi_{n,m}^{(t)}}.$$

Next, the belief generator 620 generates a belief $r_{n,m}^{(t)}$ using the transmitted signal component $s_{n,m}^{(t)}$. The belief generator 620 uses either the damping processing or the node selection processing. The damping processing calculates the weighted average of the transmitted signal component obtained in the previous (t−1)-th iteration and the transmitted signal component obtained in the current t-th iteration by using the damping factor $\eta^{(t)}$ as follows:

$$s'^{(t)}_{n,m} = \eta^{(t)} \sum_{\substack{i=1 \\ i \neq n}}^{N} s_{i,m}^{(t)} + (1 - \eta^{(t)}) s'^{(t-1)}_{n,m}$$

where $s'^{(t)}_{n,m}$ is a transmitted signal component after the damping processing. As a result of this damping processing, the equivalent gain included in $s'^{(t)}_{n,m}$ is given by the following equation:

$$\omega'^{(t)}_{n,m} = \eta^{(t)} \sum_{\substack{i=1 \\ i \neq n}}^{N} \omega_{i,m}^{(t)} + (1 - \eta^{(t)}) \omega'^{(t-1)}_{n,m}$$

On the other hand, in the node selection, $s'^{(t)}_{n,m}$ is calculated by synthesizing the transmitted signal components of the antennas obtained in the latest K iterations, which is given by the following equation:

$$s'^{(t)}_{n,m} = \sum_{k=0}^{K-1} \sum_{\substack{i=1 \\ i \neq n}}^{N} \eta_{i,t-k}^{(t)} s_{i,m}^{(t-k)}, \text{ s.t.} \sum_{k=0}^{K-1} \eta_{i,t-k}^{(t)} = 1$$

where $\eta_{i,t-k}^{(t)}$ is a node selection factor indicating how much the transmitted signal component $s_{i,m}^{(t-k)}$ is considered in the t-th iteration. In the existing node selection method, the value of the node selection factor $\eta_{i,t-k}^{(t)}$ is either 0 or 1, which means that it is alternatively determined whether or not to take the node i (i.e., observation node, receiving antenna) into account. On the other hand, in this embodiment, the node selection factor $\eta_{i,t-k}^{(t)}$ is a real number value between 0 and 1 (or a real number value not less than 0 and not greater than 1). Accordingly, the node selection factor $\eta_{i,t-k}^{(t)}$ of this embodiment is able to finely adjust how much the transmitted signal component $s_{i,m}^{(t-k)}$ of the node i is considered in the t-th iteration. Besides, the node selection factor $\eta_{i,t-k}^{(t)}$ of this embodiment is learnable (or trainable) in deep learning, as will be described later. When K=t in the above expression, the transmitted signal components obtained in all the past iterations are used in the node selection.

As a result of the node selection processing, the equivalent gain included in $s'^{(t)}_{n,m}$ is given by the following equation:

$$\omega'^{(t)}_{n,m} = \sum_{k=0}^{K-1} \sum_{\substack{i=1 \\ i \neq n}}^{N} \eta_{i,t-k}^{(t)} \omega_{i,m}^{(t)}$$

The belief generator 620 normalizes $s'^{(t)}_{n,m}$ obtained by either the damping or the node selection with $\omega'^{(t)}_{n,m}$, thereby generating a normalized belief $r_{n,m}^{(t)}$. The belief generator 620 supplies the normalized belief to the soft replica generator 630. The normalized belief $r_{n,m}^{(t)}$ is expressed by the following equation:

$$r_{n,m}^{(t)} = \frac{s'^{(t)}_{n,m}}{\omega'^{(t)}_{n,m}}.$$

(3) Soft Replica Generator

The soft replica generator 630 scales the belief $r_{n,m}^{(t)}$ with a scaling factor $a^{(t)}$ and calculates the soft replica $\hat{x}_{n,m}^{(t)}$ and soft replica's power $p_{n,m}^{(t)}$ in accordance with the following equations:

$$\hat{x}_{n,m}^{(t)} = c \sum_{s' \in S_{Q'}} \tanh\left(\frac{a^{(t)}}{c}(r_{n,m}^{(t)} - s')\right)$$

$$p_{n,m}^{(t)} = E_s^{max} + 2c \sum_{s' \in S_{Q'}} s' \tanh\left(\frac{a^{(t)}}{c}(r_{n,m}^{(t)} - s')\right)$$

where $E_s^{max}$ is the energy of the largest PAM symbol possible and s' is a determination threshold for PAM modulation. The value $E_s^{max}$ is given by the following equation:

$$E_s^{max} = (\sqrt{Q} - 1)^2 c^2$$

The determination threshold s' can have any value of a set $S_{Q'}$. The set $S_{Q'}$ is {0} for QPSK and {0, +2c, −2c} for 16QAM. The tan h function is a hyperbolic tangent function. These equations indicate that the soft replica $\hat{x}_{n,m}^{(t)}$ and the soft replica's power $p_{n,m}^{(t)}$ are generated by synthesizing belief information around the determination threshold.

(4) Output of BP Detector

After the completion of the T iterations, the belief generator 620 supplies the estimated value $r_m^{(T)}$ of each of the M separated transmitted signals to the decision and demodulation module 460. The estimated value $r_m^{(T)}$ is given by the following equation:

$$r_m^{(T)} = \left(\sum_{i=1}^{N} s_{i,m}^{(T)}\right) \bigg/ \left(\sum_{i=1}^{N} \omega_{i,m}^{(T)}\right).$$

Figure 7:
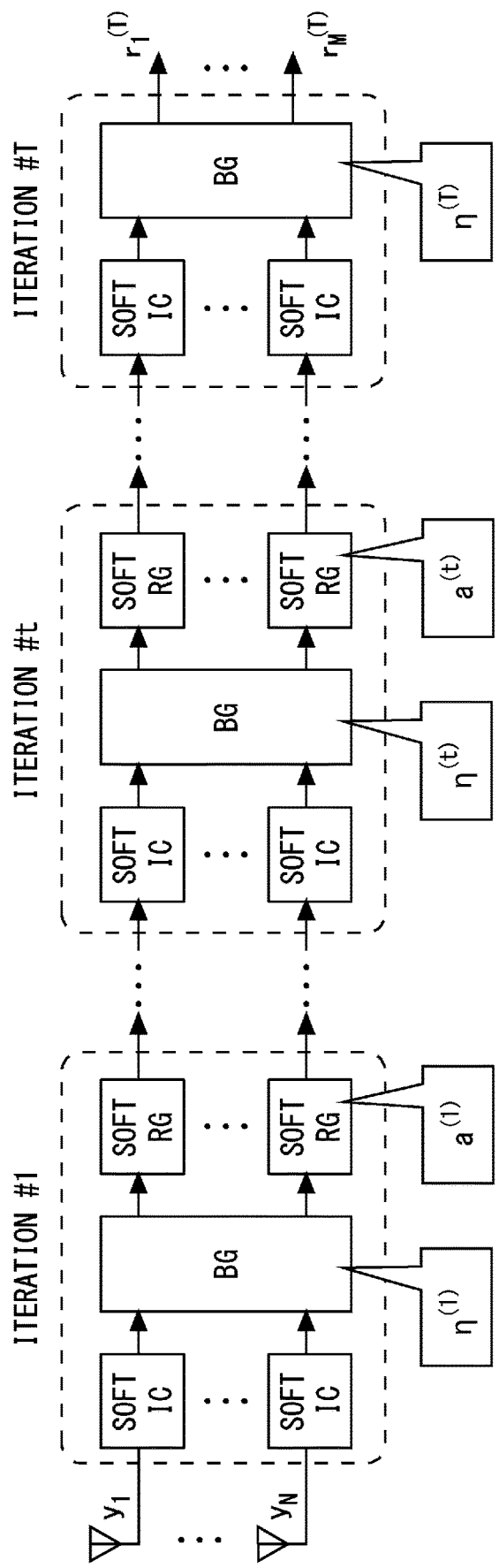
FIG. 7 is a conceptual diagram showing deep unfolding of a BP detector according to an embodiment.

The following provides a description of a method of learning the parameters to be used by the processor 304 (the BP detector 400) to perform the BP algorithm. FIG. 7 is a conceptual diagram showing deep unfolding for the multi-user detection based on the BP. The deep unfolding is a method of unfolding the iterative algorithm in the iterative direction, assuming that the obtained process flow graph is a Deep Neural Network (DNN), and using a scheme of deep learning. The BP network shown in FIG. 7 is given by unfolding the iterations performed by the BP detector 400. Each BP iteration corresponds to one layer of the DNN. Accordingly, it is possible to learn meta parameters embedded in the BP network. Specifically, the learnable (or trainable) parameters are the scaling factor $a^{(t)}$ and the damping factor $q^{(t)}$ in each iteration (or each layer), or the scaling factor $a^{(t)}$ and the set $\{\eta_{i,t-k}^{(t)}\}$ of node selection factors in each iteration (or each layer). The learning is performed, for example, based on a gradient method and the meta parameters are adjusted together in the direction in which the cost becomes smaller.

FIG. 8 shows one example of sets of the scaling factor and the damping factor obtained by deep learning. These learned parameters may be stored in the memory 305 as an LUT 450. The table shown in FIG. 8 stores learned parameters for the total numbers of BP iterations T of three values (i.e., 3, 8, and 16). In this case, the processor 304 (the BP detector 400) of the base station 1 may use in the iterative BP algorithm the subset of parameters corresponding to the configured (or selected) number of iterations T. The parameters for the number of iterations T include a scaling factor $a_T^{(t)}$ and a damping factor $\eta_T^{(t)}$ per iteration. The subscripts for these parameters indicate the total number of iterations. Specifically, when the total number of iterations T is 3, the learned parameters include: a set of a scaling factor $a_3^{(1)}$ and a damping factor $\eta_3^{(1)}$ for the first iteration; a set of a scaling factor $a_3^{(2)}$ and a damping factor $\eta_3^{(2)}$ for the second iteration; and a set of a scaling factor $a_3^{(30)}$ and a damping factor $\eta_3^{(3)}$ for the third iteration.

FIG. 9 shows one example of combinations of a scaling factor and node selection factors obtained by deep learning. Like in the table shown in FIG. 8, the table shown in FIG. 9 stores learned parameters for the cases that the total numbers of BP iterations T are 3, 8, and 16. The parameters for the number of iterations T include a scaling factor $a_T^{(t)}$ and a set $\{\eta_{T,t-k}^{(t)}\}$ of node selection factors per iteration.

The examples shown in FIGS. 8 and 9 are merely examples. In another example, the BP detector 400 may operate only with one fixed value of the total number of iterations. In this case, the base station 1 may be supplied only with the learned parameters for this value of the total number of iterations. Alternatively, the base station 1 may be supplied with learned parameters for four or more values of the total number of iterations.

Figure 10:
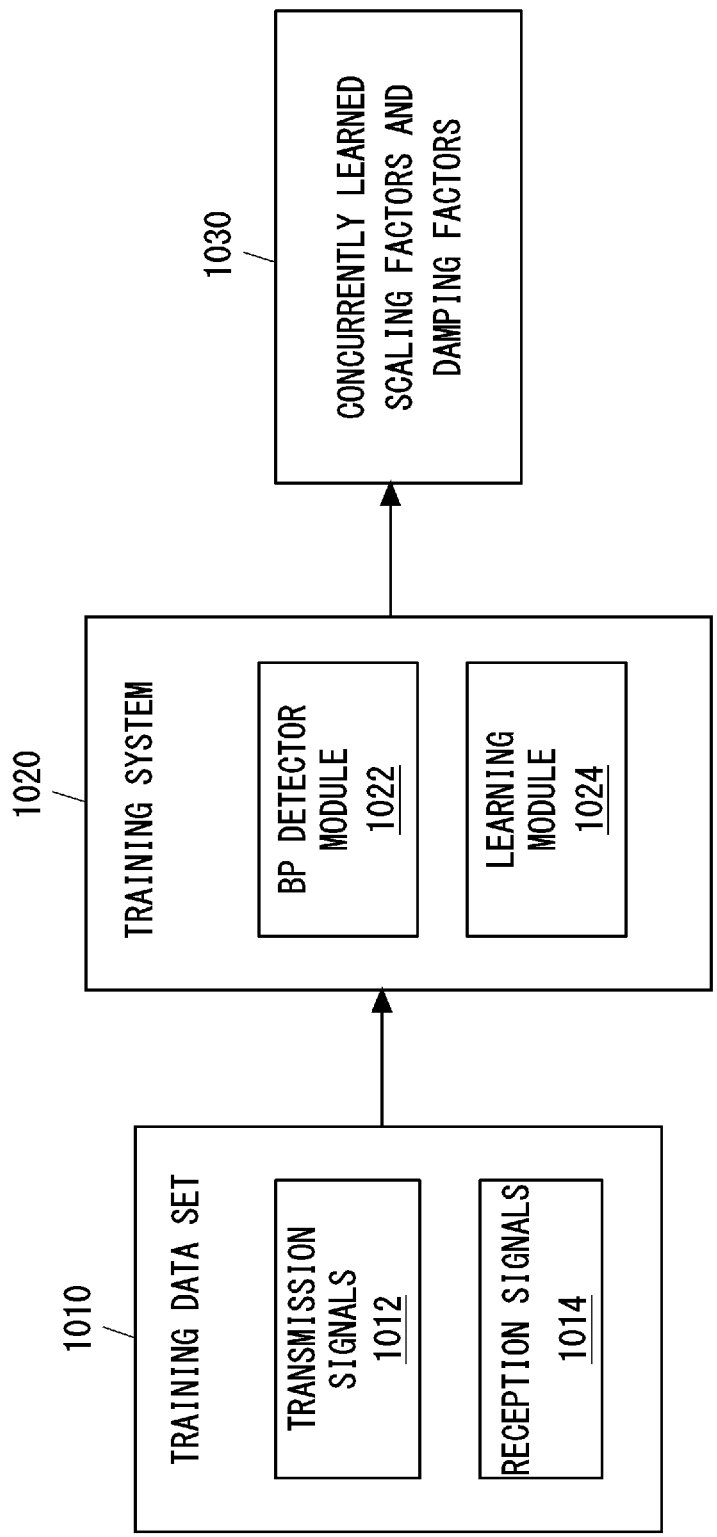
FIG. 10 is a diagram showing a configuration example of a training system according to the embodiment.

FIG. 10 shows one example of the training system environment. A training data set 1010 includes a transmitted signal data set 1012 and a received signal data set 1014. The transmitted signal data set 1012 may be randomly generated. The received signal data set 1014 corresponds to the transmitted signal data set 1012 and is generated using the transmitted signal data set 1012 and a given channel matrix. The channel matrix may be randomly generated or may be generated based on a propagation path model defined in the 3rd Generation Partnership Project (3GPP) specifications or the like. Alternatively, the channel matrix may be generated based on measurement results in the actual environment where the base station 1 is installed.

A training system 1020 includes a BP detector module 1022 and a learning module 1024. The BP detector module 1022 emulates the processor 304 or the BP detector 400 of the base station 1. The BP detector module 1022 is able to execute a BP algorithm that is the same as the BP algorithm implemented in the base station 1. The learning module 1024 trains the BP detector module 1022 using the training data set 1010. The learning module 1024 may apply one or more machine learning algorithms.

In one example, the learning module 1024 may use an update algorithm, such as a gradient method. The gradient update method to be used may be, for example, an Adaptive moment estimation (Adam) optimizer algorithm. In addition, the learning module 1024 may use mini-batch learning. The number of learning iterations may be set to an appropriate value in view the risk of overfitting to the training data. To update the learning rate, a Step algorithm that gradually narrows the update width with respect to the number of learning iterations may be used. The cost function may be a Mean Square Error (MSE).

The learning module 1024 outputs a trained parameter set 1030 obtained by machine learning. The trained parameter set 1030 includes a plurality of scaling factors and a plurality of damping factors (or a plurality of scaling factors and a plurality of node selection factors).

Figure 11:
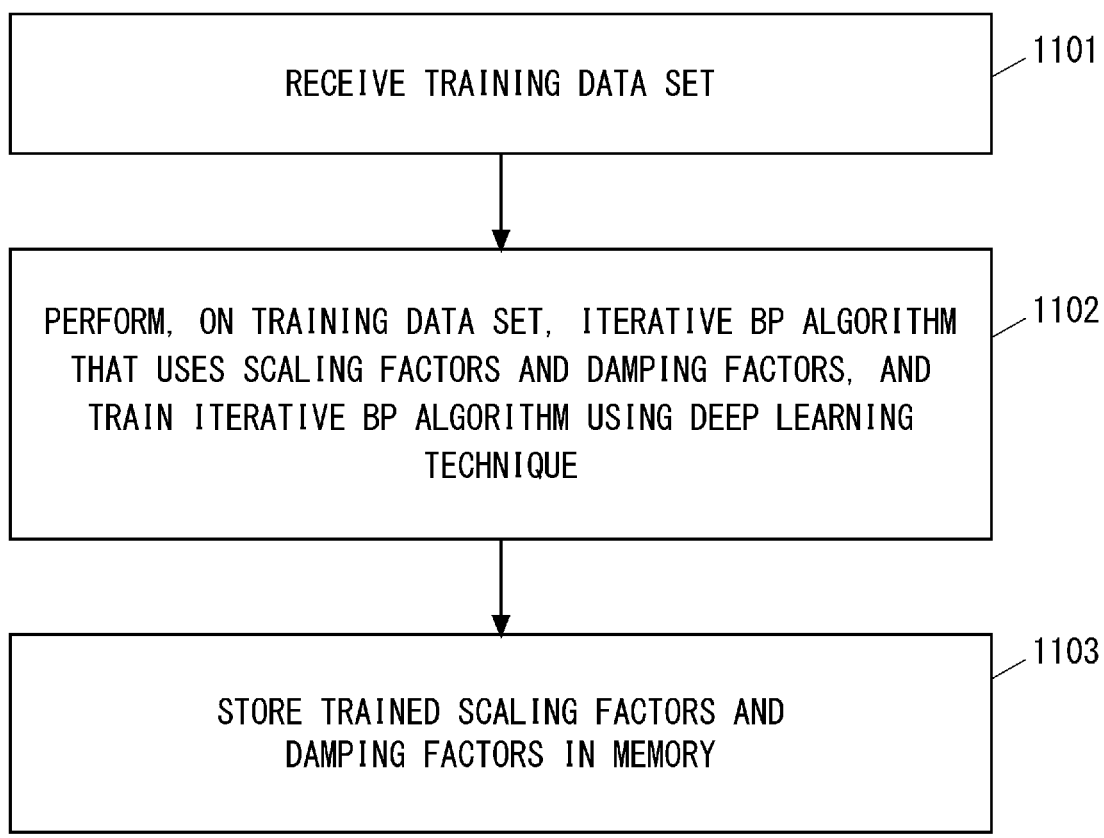
FIG. 11 is a flowchart showing one example of training according to an embodiment.

FIG. 11 shows one example of an operation of the training system 1020. In Step 1101, the training system 1020 receives the training data set 1010. In Step 1102, the training system 1020 performs, on the training data set 1010, an iterative BP algorithm that uses scaling factors and damping factors and trains the iterative BP algorithm using a deep learning technique. The trainable parameters are the scaling factors and the damping factors. In Step 1103, the training system 1020 stores the trained scaling factors and damping factors in a memory.

Alternatively, in Step 1102, the training system 1020 may perform an iterative BP algorithm that uses scaling factors and node selection factors, on the training data set 1010. In this case, the trainable parameters are the scaling factors and the node selection factors and, in Step 1103, the training system 1020 stores the trained scaling factors and node selection factors in a memory.

Figure 12:
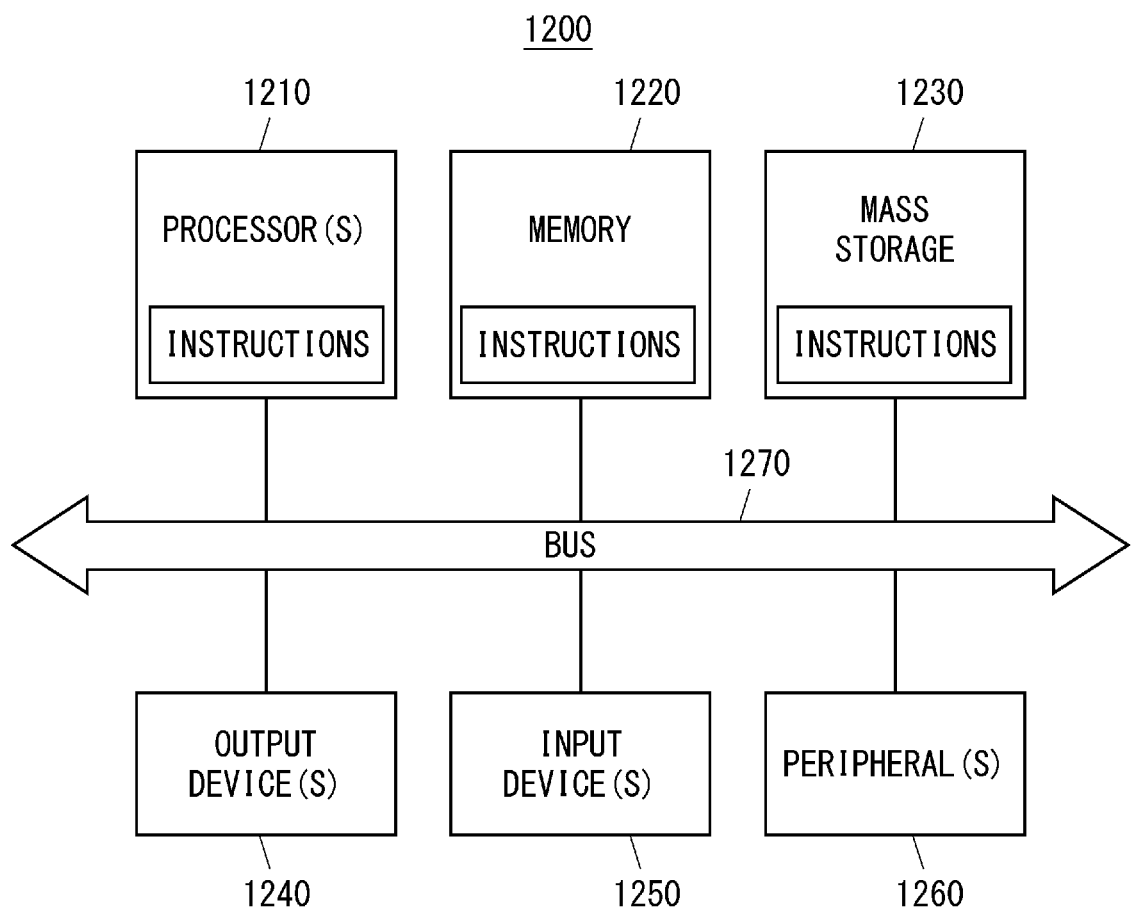
FIG. 12 is a flowchart showing one example of a computer system according to an embodiment.

The training system 1020 may be a computer system as shown in FIG. 12. FIG. 12 shows a configuration example of a computer system 1200. The computer system 1200 is able to execute one or more computer programs including a set of instructions, thereby performing, for example, a method for the training system 1020. The training system 1020 may be a standalone computer or may include one or more networked computers. The computer system 1200 may be one or both of a server and a client in a server-client environment. The computer system 1200 may be a personal computer, a tablet computer, or a smartphone.

In the example shown in FIG. 12, the computer system 1200 includes one or more processors 1210, a memory 1220, and a mass storage 1230, which communicate with one another via a bus 1270. The one or more processors 1210 may include, for example, one or both of a central processing unit(s) (CPU(s)) and a graphics processing unit(s) (GPU(s)). The computer system 1200 may include other devices, such as one or more output devices 1240, one or more input devices 1250, and one or more peripherals 1260. The one or more output devices 1240 include, for example, a video display and a speaker. The one or more input devices 1250 include, for example, a keyboard, a mouse, a keypad, a touch pad, a touch screen, or any combination thereof. One or more peripherals 1260 include, for example, a printer, a modem, a network adapter, or any combination thereof.

One or both of the memory 1220 and the mass storage 1230 include a computer readable medium storing one or more sets of instructions. These instructions may be partially or fully stored in a memory in the processor 1210. These instructions, when executed on the processor 1210, cause the processor 120 to perform, for example, the machine learning process described with reference to FIG. 11.

As described above, in some implementations, the processor 304 included in the base station 1 executes one or more programs including instructions for causing a computer to execute the algorithm described in this embodiment. In addition, the training system 1020 executes one or more programs including instructions for causing a computer to execute machine learning described in this embodiment. Each of these programs can be stored and provided to a computer using any type of non-transitory computer readable media. Non-transitory computer readable media include any type of tangible storage media. Examples of non-transitory computer readable media include magnetic storage media (such as flexible disks, magnetic tapes, hard disk drives, etc.), optical magnetic storage media (e.g., magneto-optical disks), Compact Disc Read Only Memory (CD-ROM), CD-R, CD-R/W, and semiconductor memories (such as mask ROM, Programmable ROM (PROM), Erasable PROM (EPROM), flash ROM, Random Access Memory (RAM), etc.). Each of the programs may be provided to a computer using any type of transitory computer readable media. Examples of transitory computer readable media include electric signals, optical signals, and electromagnetic waves. Transitory computer readable media can provide the program to a computer via a wired communication line (e.g., electric wires, and optical fibers) or a wireless communication line.

Figure 13:
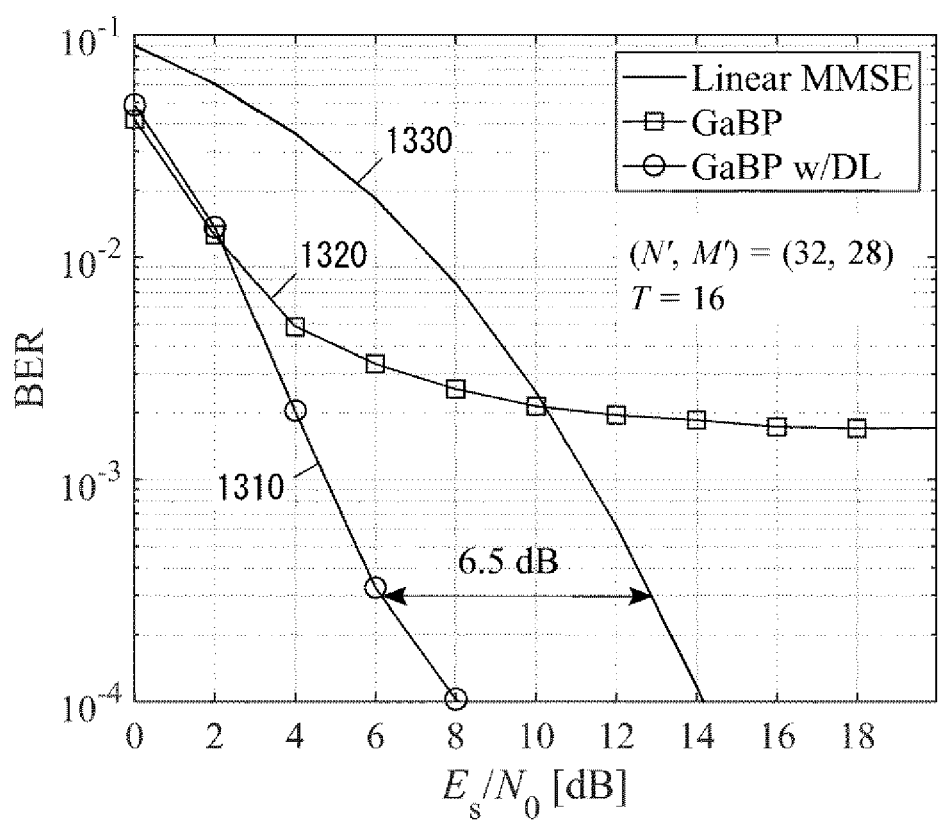
FIG. 13 is a diagram showing a code error rate performance of a BP detector according to an embodiment.

FIG. 13 shows comparison in bit error rate (BER) performance between the BP detector 400 according to this embodiment and an existing linear minimum mean square error (MMSE) detector. These are simulation results of the multi-user MIMO configuration of (N', M')=(32, 28), where the number of terminals is denoted by M' and the number of receiving antenna elements is denoted by N'. Note that the total number of iterations (T) is set to 16. The graph 1310 shows the BER of the BP detector that uses a parameter set of the learned damping factors and scaling factors described in this embodiment. On the other hand, the graph 1320 is a comparative example and shows the BER of a BP detector that does not use the parameter set of the learned damping factors and scaling factors. The graph 1330 is another comparative example and shows the BER of the Linear MMSE. These results confirmed that the BP detector of this embodiment can significantly reduce the error floor level, and also can improve the BER performance more greatly than the MMSE detector.

An example advantage according to the above-described embodiments is to allow the wireless receiver apparatus to use a near-optimal set of the scaling factor and the damping factor (or the scaling factor and the node selection factor) in each BP iteration.

The above-described embodiment is merely an example of applications of the technical ideas obtained by the inventors. These technical ideas are not limited to the above-described embodiment and various modifications can be made thereto.

The whole or part of the exemplary embodiments disclosed above can be described as, but not limited to, the following supplementary notes.

(Supplementary Note 1)

A wireless receiver apparatus comprising:

at least one memory configured to store a first parameter set or a second parameter set, the first parameter set including a plurality of scaling factors and a plurality of damping factors learned together using a deep learning technique, the second parameter set including a plurality of scaling factors and a plurality of node selection factors learned together using a deep learning technique; and a BP detector configured to execute an iterative Belief Propagation (BP) algorithm that uses the first parameter set or the second parameter set in order to perform multi-user detection.

(Supplementary Note 2)

The wireless receiver apparatus according to Supplementary Note 1, wherein the BP detector is configured to use the scaling factors in different respective iterations of the iterative BP algorithm, and the BP detector is configured to use the damping factors, or the node selection factors, in the different respective iterations of the iterative BP algorithm.

(Supplementary Note 3)

The wireless receiver apparatus according to Supplementary Note 1 or 2, wherein the first parameter set, or the second parameter set, comprises a plurality of subsets that correspond to different total numbers of iterations, and the BP detector is configured to use in the iterative BP algorithm a subset that corresponds to a configured number of iterations.

(Supplementary Note 4)

The wireless receiver apparatus according to any one of Supplementary Notes 1 to 3, wherein the BP detector is configured to use the second parameter set in the iterative BP algorithm, and each of the node selection factors is a real number value between 0 and 1.

(Supplementary Note 5)

The wireless receiver apparatus according to any one of Supplementary Notes 1 to 4, wherein the BP detector comprises:

an interference canceller configured to use replicas of all transmitted signals, excluding an m-th transmitted signal, generated in a (t−1)-th iteration and subtract components of all the transmitted signals, excluding a component of the m-th transmitted signal, from an n-th received signal among a plurality of received signals, thereby generating a post-cancellation n-th received signal;

a belief generator configured to generate a belief associated with the n-th received signal at least based on the damping factor or the node selection factor and based on the post-cancellation n-th received signal; and a replica generator configured to generate a replica of the m-th transmitted signal in a t-th iteration at least based on the scaling factor and the belief.

(Supplementary Note 6)

A method performed in a wireless receiver apparatus, the method comprising:

reading a first parameter set or a second parameter set from a memory, the first parameter set including a plurality of scaling factors and a plurality of damping factors learned together using a deep learning technique, the second parameter set including a plurality of scaling factors and a plurality of node selection factors learned together using a deep learning technique; and executing an iterative Belief Propagation (BP) algorithm that uses the first parameter set or the second parameter set in order to perform multi-user detection.

(Supplementary Note 7)

The method according to Supplementary Note 6, wherein the executing comprises:

using the scaling factors in different respective iterations of the iterative BP algorithm; and using the damping factors, or the node selection factors, in the different respective iterations of the iterative BP algorithm.

(Supplementary Note 8)

The method according to Supplementary Note 6 or 7, wherein the first parameter set, or the second parameter set, comprises a plurality of subsets that correspond to different total numbers of iterations, and the executing comprises using in the iterative BP algorithm a subset that corresponds to a configured number of iterations.

(Supplementary Note 9)

The method according to any one of Supplementary Notes 6-8, wherein the executing comprises using the second parameter set in the iterative BP algorithm, and each of the node selection factors is a real number value between 0 and 1.

(Supplementary Note 10)

A program for causing a processor included in a wireless receiver apparatus to:

read a first parameter set or a second parameter set from a memory, the first parameter set including a plurality of scaling factors and a plurality of damping factors learned together using a deep learning technique, the second parameter set including a plurality of scaling factors and a plurality of node selection factors learned together using a deep learning technique; and execute an iterative Belief Propagation (BP) algorithm that uses the first parameter set or the second parameter set in order to perform multi-user detection.

(Supplementary Note 11)

A method implemented in a computer, the method comprising:

receiving a set of training data, wherein each training data comprises a plurality of transmitted signals and a plurality of received signals corresponding to the plurality of transmitted signals;

executing an iterative BP algorithm in the set of training data, wherein the iterative BP algorithm uses a plurality of scaling factors and a plurality of damping factors, or uses a plurality of scaling factors and a plurality of a node selection factors; and generating a learned set of the scaling factors and the damping factors, or a learned set of the scaling factors and the node selection factors, by training the iterative BP algorithm using a deep learning technique.

What is claimed is:

1. A wireless receiver apparatus comprising:
   at least one memory configured to store a first parameter set or a second parameter set, the first parameter set including a plurality of scaling factors and a plurality of damping factors learned together using a deep learning technique, the second parameter set including a plurality of scaling factors and a plurality of node selection factors learned together using a deep learning technique; and
   a BP detector configured to execute an iterative Belief Propagation (BP) algorithm that uses the first parameter set or the second parameter set in order to perform multi-user detection.

2. The wireless receiver apparatus according to claim 1, wherein
   the BP detector is configured to use the scaling factors in different respective iterations of the iterative BP algorithm, and
   the BP detector is configured to use the damping factors, or the node selection factors, in the different respective iterations of the iterative BP algorithm.

3. The wireless receiver apparatus according to claim 1, wherein
   the first parameter set, or the second parameter set, comprises a plurality of subsets that correspond to different total numbers of iterations, and
   the BP detector is configured to use in the iterative BP algorithm a subset that corresponds to a configured number of iterations.

4. The wireless receiver apparatus according to claim 1, wherein
   the BP detector is configured to use the second parameter set in the iterative BP algorithm, and
   each of the node selection factors is a real number value between 0 and 1.

5. The wireless receiver apparatus according to claim 1, wherein the BP detector comprises:
   an interference canceller configured to use replicas of all transmitted signals, excluding an m-th transmitted signal, generated in a (t−1)-th iteration and subtract components of all the transmitted signals, excluding a component of the m-th transmitted signal, from an n-th received signal among a plurality of received signals, thereby generating a post-cancellation n-th received signal;
   a belief generator configured to generate a belief associated with the n-th received signal at least based on the damping factor or the node selection factor and based on the post-cancellation n-th received signal; and
   a replica generator configured to generate a replica of the m-th transmitted signal in a t-th iteration at least based on the scaling factor and the belief.

6. A method performed by a wireless receiver apparatus, the method comprising:
   reading a first parameter set or a second parameter set from a memory, the first parameter set including a plurality of scaling factors and a plurality of damping factors learned together using a deep learning technique, the second parameter set including a plurality of scaling factors and a plurality of node selection factors learned together using a deep learning technique; and
   executing an iterative Belief Propagation (BP) algorithm that uses the first parameter set or the second parameter set in order to perform multi-user detection.

7. The method according to claim 6, wherein the executing comprises:
   using the scaling factors in different respective iterations of the iterative BP algorithm; and
   using the damping factors, or the node selection factors, in the different respective iterations of the iterative BP algorithm.

8. The method according to claim 6, wherein
   the first parameter set, or the second parameter set, comprises a plurality of subsets that correspond to different total numbers of iterations, and
   the executing comprises using in the iterative BP algorithm a subset that corresponds to a configured number of iterations.

9. The method according to claim 6, wherein
   the executing comprises using the second parameter set in the iterative BP algorithm, and
   each of the node selection factors is a real number value between 0 and 1.

10. A non-transitory computer readable medium storing a program comprising instructions, which when executed on a processor of a wireless receiver apparatus causes the processor to:
- read a first parameter set or a second parameter set from a memory, the first parameter set including a plurality of scaling factors and a plurality of damping factors learned together using a deep learning technique, the second parameter set including a plurality of scaling factors and a plurality of node selection factors learned together using a deep learning technique; and
- execute an iterative Belief Propagation (BP) algorithm that uses the first parameter set or the second parameter set in order to perform multi-user detection.

11. The non-transitory computer readable medium according to claim 10, wherein the executing comprises:
- using the scaling factors in different respective iterations of the iterative BP algorithm; and
- using the damping factors, or the node selection factors, in the different respective iterations of the iterative BP algorithm.

12. The non-transitory computer readable medium according to claim 10, wherein
- the first parameter set, or the second parameter set, comprises a plurality of subsets that correspond to different total numbers of iterations, and
- the executing comprises using in the iterative BP algorithm a subset that corresponds to a configured number of iterations.

13. The non-transitory computer readable medium according to claim 10, wherein
- the executing comprises using the second parameter set in the iterative BP algorithm, and
- each of the node selection factors is a real number value between 0 and 1.

* * * * *